US008432690B2

(12) United States Patent
Fink et al.

(10) Patent No.: US 8,432,690 B2
(45) Date of Patent: Apr. 30, 2013

(54) DATA CENTER COOLING

(75) Inventors: James R. Fink, Exeter, RI (US); John H. Bean, Jr., Wentzville, MO (US); Stephen F. Held, Wildwood, MO (US); Richard J. Johnson, Chesterfield, MO (US); Rollie R. Johnson, Chesterfield, MO (US)

(73) Assignee: American Power Conversion Corporation, West Kingston, RI (US)

( * ) Notice: Subject to any disclaimer, the term of this patent is extended or adjusted under 35 U.S.C. 154(b) by 0 days.

(21) Appl. No.: 12/986,120

(22) Filed: Jan. 6, 2011

(65) Prior Publication Data

US 2011/0103014 A1 May 5, 2011

Related U.S. Application Data

(63) Continuation of application No. 12/698,877, filed on Feb. 2, 2010, now Pat. No. 7,881,057, which is a continuation of application No. 12/408,616, filed on Mar. 20, 2009, now Pat. No. 7,684,193, which is a continuation of application No. 11/653,047, filed on Jan. 12, 2007, now Pat. No. 7,529,086, which is a continuation of application No. 11/404,169, filed on Apr. 14, 2006, now Pat. No. 7,173,820, which is a continuation of application No. 10/863,740, filed on Jun. 7, 2004, now Pat. No. 7,046,514, which is a continuation-in-part of application No. 10/391,971, filed on Mar. 19, 2003, now Pat. No. 6,859,366.

(51) Int. Cl.
*H05K 7/20* (2006.01)

(52) U.S. Cl.
USPC . 361/695; 361/690; 361/679.46; 361/679.49; 165/121; 165/122; 165/104.33; 454/184

(58) Field of Classification Search ............ 361/679.46–679.53, 688, 689, 690–699, 724–728, 831; 165/80.3–80.5, 104.19, 104.21, 104.33, 104.34, 165/121–126; 454/184, 187; 62/259.2, 418, 62/419, 177, 178, 186; 29/890.03, 592.1, 29/729, 830, 832, 854; 312/223.2, 223.3, 312/198, 199, 201, 334.24, 334.25
See application file for complete search history.

(56) References Cited

U.S. PATENT DOCUMENTS

| 3,559,728 A | 2/1971 | Lyman et al. |
| 4,016,357 A | 4/1977 | Abrahamsen |

(Continued)

FOREIGN PATENT DOCUMENTS

| CN | 1224991 A | 8/1999 |
| DE | 7328005 | 8/1973 |

(Continued)

OTHER PUBLICATIONS

European Search Report dated Nov. 9, 2010 for European Application No. 10008866.5, 5 pages.

(Continued)

*Primary Examiner* — Michail V Datskovskiy
(74) *Attorney, Agent, or Firm* — Gilman Clark Hunter & Messina LLC

(57) ABSTRACT

A system for restricting mixing of air in a data center includes a plurality of racks, each of the racks having a front face and a back face. The system includes an enclosure for collecting air released from the back faces of the plurality of racks, the enclosure configured to substantially contain the air in an area between the first row and the second row and having a roof panel coupled to the first row of racks and the second row of racks configured to span a distance between the first row of racks and the second row of racks. The enclosure is configured to maintain a first air pressure inside of the enclosure that is substantially equal to a second air pressure outside the enclosure.

13 Claims, 5 Drawing Sheets

U.S. PATENT DOCUMENTS

| | | | |
|---|---|---|---|
| 4,158,875 A | 6/1979 | Tajima et al. | |
| 4,261,519 A | 4/1981 | Ester | |
| 4,710,096 A | 12/1987 | Erlam | |
| 4,758,925 A * | 7/1988 | Obata et al. | 361/695 |
| 4,774,631 A | 9/1988 | Okuyama et al. | |
| 4,832,717 A | 5/1989 | Peters | |
| 4,837,663 A | 6/1989 | Zushi et al. | |
| 4,851,965 A | 7/1989 | Gabuzda et al. | |
| 4,874,127 A | 10/1989 | Collier | |
| 5,173,819 A | 12/1992 | Takahashi et al. | |
| 5,232,401 A | 8/1993 | Fujita et al. | |
| 5,416,427 A | 5/1995 | Tracewell | |
| 5,544,012 A | 8/1996 | Koike | |
| 5,657,641 A | 8/1997 | Cunningham et al. | |
| 5,671,805 A | 9/1997 | Stahl et al. | |
| 5,709,100 A | 1/1998 | Baer et al. | |
| 5,718,628 A | 2/1998 | Nakazato et al. | |
| 5,788,467 A | 8/1998 | Zenitani et al. | |
| 5,934,368 A | 8/1999 | Tanaka et al. | |
| 5,943,219 A | 8/1999 | Bellino et al. | |
| 5,949,646 A | 9/1999 | Lee et al. | |
| 5,982,652 A | 11/1999 | Simonelli et al. | |
| 6,034,873 A * | 3/2000 | St.ang.hl et al. | 361/701 |
| 6,041,851 A | 3/2000 | Diebel et al. | |
| 6,065,531 A | 5/2000 | Schneider et al. | |
| 6,164,369 A | 12/2000 | Stoller | |
| 6,185,098 B1 | 2/2001 | Benavides | |
| 6,185,481 B1 | 2/2001 | Kondou et al. | |
| 6,186,890 B1 | 2/2001 | French et al. | |
| 6,193,601 B1 | 2/2001 | Torczynski | |
| 6,198,628 B1 | 3/2001 | Smith | |
| 6,222,729 B1 | 4/2001 | Yoshikawa | |
| 6,264,550 B1 | 7/2001 | Matsumoto | |
| 6,290,597 B1 | 9/2001 | Jones et al. | |
| 6,305,180 B1 | 10/2001 | Miller et al. | |
| 6,327,143 B1 | 12/2001 | Bonstrom et al. | |
| 6,347,627 B1 | 2/2002 | Frankie et al. | |
| 6,359,565 B1 | 3/2002 | Pedoeem et al. | |
| 6,362,958 B1 | 3/2002 | Yu et al. | |
| 6,374,627 B1 | 4/2002 | Schumacher et al. | |
| 6,375,561 B1 | 4/2002 | Nicolai et al. | |
| 6,400,567 B1 | 6/2002 | McKeen et al. | |
| 6,412,292 B2 | 7/2002 | Spinazzola et al. | |
| 6,434,954 B1 | 8/2002 | Hess et al. | |
| 6,463,997 B1 | 10/2002 | Nicolai et al. | |
| 6,494,050 B2 | 12/2002 | Spinazzola et al. | |
| 6,506,111 B2 | 1/2003 | Sharp et al. | |
| 6,516,954 B2 | 2/2003 | Broome | |
| 6,574,104 B2 | 6/2003 | Patel et al. | |
| 6,616,524 B2 | 9/2003 | Storck et al. | |
| 6,672,955 B2 | 1/2004 | Charron | |
| 6,772,604 B2 | 8/2004 | Bash et al. | |
| 6,859,366 B2 | 2/2005 | Fink et al. | |
| 6,862,179 B2 | 3/2005 | Beitelmal et al. | |
| 6,980,433 B2 | 12/2005 | Fink | |
| 7,251,547 B2 | 7/2007 | Bash et al. | |
| 2001/0029163 A1 | 10/2001 | Spinazzola et al. | |
| 2001/0042616 A1 | 11/2001 | Baer | |
| 2002/0007643 A1 | 1/2002 | Spinazzola et al. | |
| 2002/0185262 A1 | 12/2002 | Baer | |
| 2003/0050003 A1 | 3/2003 | Charron | |
| 2003/0065751 A1 * | 4/2003 | Autor et al. | 709/220 |
| 2004/0184232 A1 | 9/2004 | Fink | |
| 2004/0218355 A1 | 11/2004 | Bash et al. | |
| 2004/0223300 A1 | 11/2004 | Fink et al. | |
| 2005/0099770 A1 | 5/2005 | Fink | |
| 2005/0225936 A1 | 10/2005 | Day | |
| 2006/0139877 A1 | 6/2006 | Germagian | |
| 2007/0076373 A1 | 4/2007 | Fink | |

FOREIGN PATENT DOCUMENTS

| | | | |
|---|---|---|---|
| DE | 3623097 A1 | 1/1988 | |
| DE | G 88 07 768.3 U1 | 2/1989 | |
| DE | 19817917 A1 | 10/1999 | |
| DE | 201 08 669 U1 | 2/2002 | |
| EP | 0190835 A1 | 8/1986 | |
| EP | 0621451 A2 | 10/1994 | |
| JP | 57-068100 | 4/1982 | |
| JP | 58-87897 | 5/1983 | |
| JP | 59-015519 | 4/1984 | |
| JP | 62-202949 | 9/1987 | |
| JP | 63-222916 | 9/1988 | |
| JP | 01-273395 | 11/1989 | |
| JP | 02-98197 | 4/1990 | |
| JP | 02-192534 | 7/1990 | |
| JP | 02-225929 | 7/1990 | |
| JP | 03-85797 | 4/1991 | |
| JP | 03-177096 | 8/1991 | |
| JP | 03-231496 | 10/1991 | |
| JP | 03-128989 | 12/1991 | |
| JP | 04-368199 | 12/1992 | |
| JP | 05-106888 | 4/1993 | |
| JP | 405160592 A * | 6/1993 | |
| JP | 05-235570 | 9/1993 | |
| JP | 07-042180 | 2/1995 | |
| JP | 07-202464 | 8/1995 | |
| JP | 07-228249 | 8/1995 | |
| JP | 08-005115 | 12/1996 | |
| JP | 09-097989 | 4/1997 | |
| JP | H9-97989 | 4/1997 | |
| JP | 11-054974 | 2/1999 | |
| JP | 11-223358 | 8/1999 | |
| JP | 2000-165079 | 6/2000 | |
| JP | 2000-346419 | 12/2000 | |
| JP | 3075300 | 2/2001 | |
| JP | 2002-156136 | 5/2002 | |
| JP | 2002-156136 A | 5/2002 | |
| JP | 2003-166729 A | 6/2003 | |
| WO | 98-45934 | 10/1998 | |
| WO | WO 98/45934 | 10/1998 | |
| WO | WO 01/62060 A1 | 8/2001 | |
| WO | WO 02/12797 A2 | 2/2002 | |
| WO | WO 2006/124240 A2 | 11/2006 | |

OTHER PUBLICATIONS

IBM, "Inter-rack flow seperator to prevent computer rack hot exhaust air entry into cold region at rack inlet of computer data center facilities", IP.com Journal, IP.Com, Inc., West Henrietta, NY, USA, Jun. 20, 2006, 5 pages.

"Improved cooling system for rack-mounted equipment," IBM Technical Disclosure Bulletin 31(12):140-1, May 1989.

European Search Report dated Jul. 2, 2009 for European Application No. EP09006095, 7 pages.

International Search Report dated Jul. 30, 2007 for International Application No. PCT/US2006/016253, 1 page.

International Search Report dated Nov. 9, 2004 for International Application No. PCT/US2004/008580, 4 pages.

International Search Report dated Oct. 28, 2005 for International Application No. PCT/US2005/019970, 2 pages.

Supplementary European Search Report dated Jul. 8, 2009 for European Application No. EP06751774, 2 pages.

* cited by examiner

DATA CENTER COOLING

CROSS-REFERENCES TO RELATED APPLICATIONS

This application is a continuation of U.S. patent application Ser. No. 12/698,877 filed Feb. 2, 2010, which is a continuation of U.S. patent application Ser. No. 12/408,616 now U.S. Pat. No. 7,684,193, filed on Mar. 20, 2009, which is a continuation of U.S. patent application Ser. No. 11/653,047 now U.S. Pat. No. 7,529,086, filed on Jan. 12, 2007, which is a continuation of application Ser. No. 11/404,169 now U.S. Pat. No. 7,173,820, filed on Apr. 14, 2006, which is a continuation of application Ser. No. 10/863,740 now U.S. Pat. No. 7,046,514, filed on Jun. 7, 2004, which is a continuation-in-part of application Ser. No. 10/391,971 now U.S. Pat. No. 6,859,366, filed on Mar. 19, 2003.

BACKGROUND

Communications and information technology equipment is commonly designed for mounting to racks and for housing within enclosures. Equipment racks and enclosures are used to contain and to arrange communications and information technology equipment, such as servers, CPUs, internetworking equipment and storage devices, in small wiring closets as well as equipment rooms and large data centers. An equipment rack can be an open configuration and can be housed within a rack enclosure. A standard rack typically includes front-mounting rails to which multiple units of equipment, such as servers and CPUs, are mounted and stacked vertically within the rack. The equipment capacity of a standard rack relates to the height of the mounting rails. The height is set at a standard increment of 1.75 inches, which is expressed as "U" units or the "U" height capacity of a rack. A typical U height or value of a rack is 42 U. A standard rack at any given time can be sparsely or densely populated with a variety of different components as well as with components from different manufacturers.

Most rack-mounted communications and information technology equipment consumes electrical power and generates heat. Heat produced by rack-mounted equipment can have adverse effects on the performance, reliability and useful life of the equipment components. In particular, rack-mounted equipment housed within an enclosure is particularly vulnerable to heat build-up and hot spots produced within the confines of the enclosure during operation. The amount of heat generated by a rack is dependent on the amount of electrical power drawn by equipment in the rack during operation. Heat output of a rack can vary from a few watts per U unit of rack capacity up to 500 watts per U unit, or even higher, depending on the number and the type of components mounted to the rack. Users of communications and information technology equipment add, remove, and rearrange rack-mounted components as their needs change and new needs develop. The amount of heat a given rack or enclosure can generate, therefore, can vary considerably from a few tens of watts up to about 10,000 watts and beyond.

Rack-mounted equipment typically cools itself by drawing air along a front side or air inlet side of a rack or enclosure, drawing air through its components, and subsequently exhausting air from a rear or vent side of the rack or enclosure. Air flow requirements to provide sufficient air for cooling, thus, can vary considerably as a result of the number and the type of rack-mounted components and the configurations of racks and enclosures.

Equipment rooms and data centers are typically equipped with an air conditioning or cooling system that supplies and circulates cool air to rack-mounted equipment and enclosures. Many air conditioning or cooling systems, such as the system disclosed in U.S. Pat. No. 6,494,050, require that an equipment room or data center have a raised floor construction to facilitate the system's air conditioning and circulation functions. These systems typically use open floor tiles and floor grills or vents to deliver cool air from the air passageway disposed below the raised floor of an equipment room. Open floor tiles and floor grills or vents are typically located in front of equipment racks and enclosures, and along aisles between rows of racks and enclosures arranged side-by-side.

The cooling systems and methods that require a raised floor construction typically do not efficiently meet the cooling requirements of rack-mounted equipment. In particular, racks that include high-power equipment having a thermal exhaust air output above 5,000 watts and up to 10,000 watts present a particular challenge for such systems and methods. A raised floor construction typically provides an open floor tile or a floor grill or vent having a venting area of about 12 by 12 inches and is configured to deliver from about 200 cfm to about 500 cfm of cool air. A rack of high-power equipment drawing up to 10,000 watts or more and requiring an air flow of approximately 1,600 cfm, therefore, would need about 3.2 to about 8 open floor tiles, grills or vents disposed around the rack's perimeter to supply sufficient cool air to meet its cooling requirements. Such a floor configuration would be difficult to achieve in equipment rooms crowded with racks and enclosures, and impossible to implement if racks and enclosures are arranged side-by-side in rows. Air cooling systems and methods that incorporate raised floor configurations, thus, are typically only used with racks and enclosures spaced apart to provide sufficient floor area to accommodate multiple open floor tiles, grills or vents. For typical rack spacing, this places a limit on the density of equipment that can be achieved. When a raised floor is not used, the problem of distributing cool air from one or more centralized air conditioning systems is even greater, as the cool air typically must be distributed across a room containing rows of racks.

Equipment rooms and data centers are often reconfigured to meet new and/or different equipment needs that require individual racks and enclosures to be relocated and/or replaced. In this context, raised floor air cooling systems and methods are inflexible and can typically only be reconfigured and/or retrofitted to service rearranged, relocated and/or newly installed equipment racks at considerable cost. Raised floor configurations cannot easily and inexpensively accommodate the manner by which users typically deploy equipment racks and reconfigure equipment rooms and data centers to meet their new or changing needs.

In addition, cooling systems and methods that require raised floor construction lack physical flexibility and portability to operatively account for a wide variation in electrical power consumption between different racks and enclosures in an equipment room, and, in particular, between racks and enclosures located in the same row. Cooling systems and methods that rely upon raised floor air passageways and open floor tiles, grills or vents to supply cool air cannot easily and inexpensively vary or concentrate cool air to those high power racks that consume relatively large amounts of electrical power and have a high thermal air exhaust output. In addition, newly installed equipment may draw more electrical power than replaced or existing equipment to create thermal problem areas in functioning equipment rooms.

Further, a particular problem with existing air conditioning solutions is that hot spots can develop in a room due to a lack of proper recirculation of exhaust air from racks to the return side of a room air conditioner. This can cause racks to undesirably draw warm air into the racks. To attempt to overcome air circulation problems, many room air conditioners are designed to provide very cool air of approximately 58 degrees F. and receive return air having a typical temperature of approximately 78 degrees F. One problem with such air conditioners is that with an output air temperature of 58 degrees F., and the latent cooling occurring to achieve this temperature, it is often necessary to add a humidification system to increase moisture in the air in a data center. Such humidification systems can be expensive to install and operate.

Therefore, it is desirable to provide a system and method for cooling rack-mounted communications and information technology equipment such that equipment cooling requirements are met efficiently and economically, both for data centers that have a raised floor and for data centers that do not have a raised floor. A rack cooling system and method that is inexpensive, and able to support groups of particularly high power racks and/or enclosures, or to overcome local thermal problem areas in an equipment room or data center is desirable.

SUMMARY

An example of a modular data center includes a plurality of racks, each of the racks having a front face and a back face, wherein the plurality of racks is arranged in a first row and a second row, such that the back faces of racks of the first row are facing the second row, and the back faces of the racks of the second row are facing the first row. The data center also includes a first end panel coupled between a first rack of the first row and a first rack of the second row, the first end panel having a bottom edge and a top edge. Further, the data center includes a second end panel coupled between a second rack of the first row and a second rack of the second row, the second end panel having a top edge and a bottom edge, and a roof panel is included to couple between the top edge of the first panel and the top edge of the second panel.

The modular data center can be designed so that the roof panel is coupled to a top portion of at least one rack of the first row and to a top portion of at least one rack of the second row, such that the roof panel, the first end panel, the second end panel, and the first and second rows of racks form an enclosure around an area between the first row of racks and the second row of racks. The plurality of racks can further include cooling equipment that draws air from the area, cools the air and returns cooled air out of the front face of one of the racks. At least one of the first end panel and the second end panel can include a door. Further, at least a portion of the roof panel can be translucent. The modular data center can have at least one rack that includes an uninterruptible power supply to provide uninterrupted power to equipment in at least one other rack of the plurality of racks. The first row of racks in the modular data center can be substantially parallel to the second row. In addition, the modular data center can be designed such that one of the plurality of racks includes cooling equipment that draws air from an area between the first row and the second row, cools the air and returns cooled air out of the front face of one or more of the racks.

An example of a method of cooling electronic equipment contained in racks in a data center includes arranging the racks in two rows, including a first row and a second row that is substantially parallel to the first row, with a back face of at least one of the racks of the first row facing towards a back face of at least one of the racks of the second row. The method also includes forming an enclosure around an area between the first row and the second row, and drawing air from the area into one of the racks and passing the air out of a front face of the one of the racks.

The method can include a further step of cooling the air drawn into the one of the racks prior to passing the air out of the front face. The step of forming an enclosure may include coupling first and second side panels and a roof panel between the first row and the second row. At least one of the first side panel and the second side panel may include a door and the roof panel can include a translucent portion. Additionally, the method can include using an uninterruptible power supply to provide power to equipment in the racks.

Another example of a modular data center includes a plurality of racks, each of the racks having a front face and a back face, wherein the plurality of racks is arranged in a first row and a second row, such that the back faces of the racks of the first row are facing the second row, and the back faces of the racks of the second row are facing the first row. The modular data center further includes means for enclosing a first area between the first row and the second row, and means for drawing air from the enclosed area, cooling the air, and returning cooled air to a second area.

The means for drawing air can further include means for passing cooled air through the front face of one of the racks. The modular data center can also be comprised of means for providing uninterruptible power to equipment in the racks. Access means for allowing access into the first area may also be a design feature of the modular data center.

Still another example of a modular data center includes a plurality of equipment racks, each of the equipment racks being configured to draw cooling air from a first area and to provide exhaust air to a second area, and at least one enclosure panel coupled between a first rack and a second rack of the plurality of equipment racks. At least one of the equipment racks includes cooling equipment configured to draw exhaust air from the second area and to provide cool air to the first area, and the plurality of equipment racks and the at least one enclosure panel are arranged to substantially enclose the second area.

The at least one enclosure panel can be a roof panel coupled from a roof of one equipment rack to a roof of another equipment rack. The data center can further include at least one end panel disposed between one of the plurality of equipment racks and another one of the plurality of equipment racks, the at least one end panel including a door that provides access from the first area to the second area. At least a portion of the roof panel can be translucent, and at least one of the plurality of equipment racks can include an uninterruptible power supply.

An example of a method of cooling equipment in a plurality of equipment racks includes drawing cooling air from a first area into at least one of the equipment racks and providing exhaust air from the at least one of the equipment racks into a second area, providing an enclosure around the second area, drawing exhaust air from the second area into a second one of the plurality of equipment racks, cooling the exhaust air to produce cooled air, and providing the cooled air into the first area. The method can also include arranging the plurality of equipment racks to form two rows with the second area being between the rows.

An example of a modular data center for housing and cooling electronic equipment includes multiple housings, a first portion of the housings configured to hold heat-producing electronic equipment and a second portion of the housings configured to hold at least one cooling unit, each of the housings of the first portion having a front and a back and configured to hold the heat-producing electronic equipment such that gas is drawn into the equipment from fronts of the equipment, heated by the equipment to become heated gas, and vented by the electronic equipment through the backs of the housings, and at least one panel coupled to a pair of the housings to bridge a gap between the pair of the housings, where the housings and the at least one panel are disposed and coupled to form a laterally-enclosed arrangement laterally enclosing a hot region and defining a top opening allowing gas to vertically exit the hot region, and where backs of the housings of the first portion are disposed adjacent to the hot region such that the heat-producing equipment, when mounted to the housings, will expel the heated gas into the hot region.

Items described herein may include one or more of the following features. The data center further includes the at least one cooling unit, the at least one cooling unit being configured to draw heated gas from the hot region into the at least one cooling unit, cool the heated gas to become relatively cool gas, and to expel the heated gas from the at least one cooling unit to a cool region that is separated from the hot region the housings. The at least one cooling unit is configured to direct the cool gas toward fronts of the first portion of the housings. The at least one cooling unit is configured to direct the cool gas toward bottom portions of the fronts of the first portion of the housings. The at least one cooling unit is configured to cool the gas to, and expel the gas at, approximately 72° F. The data center further includes an uninterruptible power supply coupled to the at least one cooling unit and configured to provide backup power to the at least one cooling unit.

Items described herein may also include one or more of the following features. The at least one panel is a door configured to be opened to provide access to the hot region and to be closed to inhibit hot gas from the hot region exiting the data center laterally from the hot region through the gap. The at least one panel is at least approximately a height of a shortest one of the first and second portions of the housings. The plurality of housings are disposed in two parallel rows, and wherein the at least one panel includes two doors disposed at opposite ends of the rows and coupling the two rows to each other at the respective ends.

An example of a system for containing and cooling electronic equipment that produces heat during operation includes multiple housings, a first portion of the housings being configured to allow gas to pass through fronts of the housings, through interiors of the housings, and out through backs of the housings, the first portion of the housings being further configured to contain the electronic equipment in an arrangement such that the equipment will draw gas through the fronts of the housings, through the equipment thereby heating the gas to produce heated gas, and expelling the heated gas through the backs of the housings, the plurality of housings being disposed to form a substantial portion of a lateral enclosure laterally surrounding a hot region, closure means for laterally coupling at least two of the housings to complete the lateral enclosure surrounding the hot region, the closure means and the plurality of housings providing a top opening such that the system provides substantially no upper bounds to the hot region, and cooling means, disposed in at least one of the housings, for cooling the heated gas to produce the relatively cool gas and to provide a relatively cool gas to fronts of the first portion of the housings, where the plurality of housings are disposed such that the electronic equipment, while operating, will expel the heated gas into the hot region.

Items described herein may include one or more of the following features. The cooling means is configured to direct the relatively cool gas toward bottom portions of the fronts of the first portion of the housings. The cooling means is configured to cool the heated gas to approximately 72° F. to produce the relatively cool gas. The closure means includes at least one thermally-insulated door configured to be opened to provide access to the hot region and closed to inhibit the heated gas from laterally exiting the hot region between the housings to which the closure means is coupled. The housings are disposed in two parallel rows, and wherein the closure means includes two doors disposed at opposite ends of the rows and coupling the two rows to each other at the respective ends. The system further includes an uninterruptible power supply coupled to the cooling means and configured to provide backup power to the cooling means.

An example of a method of operating and cooling rack-mounted electronic equipment includes powering the rack-mounted electronic equipment to draw gas into housings containing the equipment through fronts of the housings, heat the gas to produce heated gas, and expel the heated gas into a hot region, inhibiting the heated gas from laterally exiting the hot region, except into a cooling mechanism, using the housings containing the equipment and at least one panel coupled to at least two of the housings while allowing the heated gas to upwardly exit the hot region substantially unimpeded at least until the gas rises above tops of the housings, drawing in at least some of the heated gas from the hot region into the cooling mechanism and cooling the drawn-in gas to produce cool gas, and providing the cool gas to fronts of the housings.

Techniques described herein may include one or more of the following features. The inhibiting includes injecting more heated gas into the hot region and impeding lateral flow of the heated gas with at least one barrier coupled between a gap between a pair of the housings. The providing includes directing the cool gas toward bottoms of the fronts of the housings.

The items and techniques described herein will be more fully understood after a review of the following figures, detailed description and claims.

DETAILED DESCRIPTION

Embodiments described herein provide a data center infrastructure having a cooling system for cooling rack-mounted electronic equipment. Embodiments provide a modular data center for rack-mounted equipment, wherein the modular data center provides power distribution, cooling and structural support for the rack-mounted equipment. The power distribution unit and cooling is provided in some embodiments using redundant systems to prevent downtime due to electrical or mechanical failures. As understood by those skilled in the art, other embodiments are within the scope of the invention, such as embodiments used to provide infrastructure for equipment other than electronic equipment.

A system for providing power distribution for rack-mounted equipment, which can be used with embodiments described herein, is described in U.S. patent application Ser. No. 10/038,106, entitled, "Adjustable Scalable Rack Power System and Method," which is herein incorporated by reference.

Figure 1:
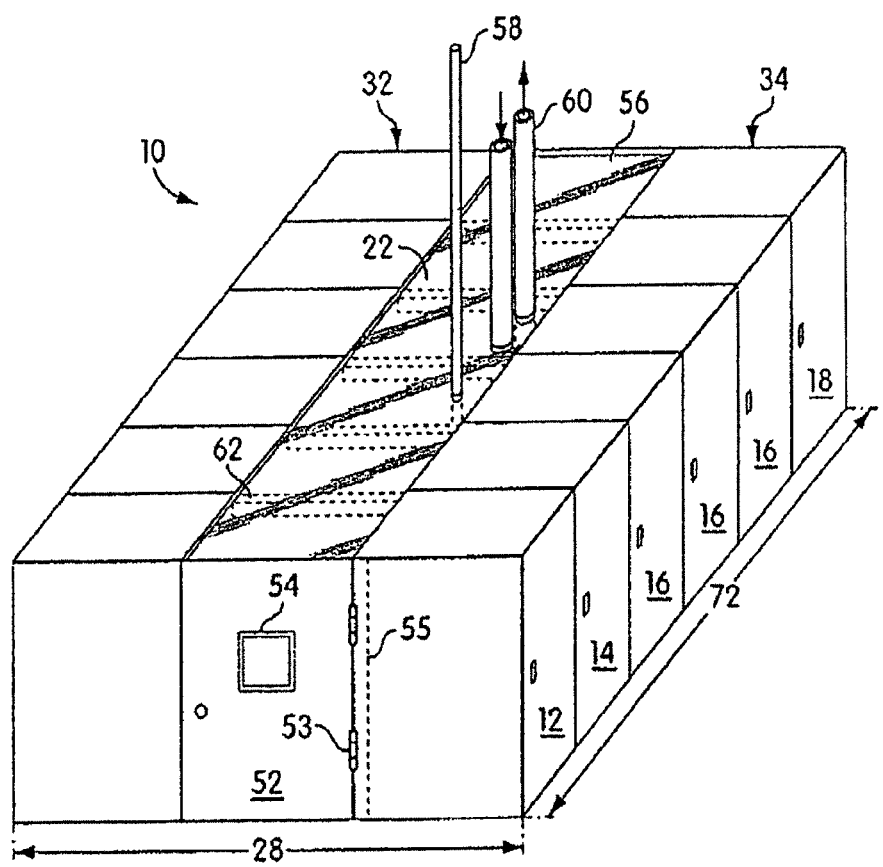
FIG. 1 is a perspective view of a modular data center cooling system for rack-mounted equipment.

Referring to FIG. 1, a perspective view of a modular data center 10 is shown. The modular data center 10 includes a power distribution unit 14, a power protection unit 12, a floor mounted cooling unit 16, equipment racks 18, and a hot room 22. The modular data center 10 also has a door 52 having a window 54, a roof 56, a cooling water supply and return 60, and a voltage feed 58. The cooling water supply and return 60 can consist of condenser water in the event that the cooling unit 16 is of the liquid cooled direct expansion variety, chilled water if cooling unit 16 is of the chilled water variety, or refrigerant supply and return if cooling unit 16 is of the air cooled direct expansion variety. The data center 10 is a modular unit comprised of the power distribution unit 14, the power protection unit 12 the floor mounted cooling unit 16, and equipment racks 18 positioned adjacent to each other to form a row 32 and a row 34. Row 32 and row 34 are substantially parallel. The power distribution unit 14 and the power protection unit 12 can be located directly adjacent to one another, and can be located at the end of one of the rows. The floor-mounted cooling unit 16 may be located and positioned adjacent to the power distribution unit 14. Remaining enclosures forming the at least one additional row in the data center 10 are equipment racks 18. The hot room 22 is located between row 32 and row 34, and rows 32 and 34 comprise two of the perimeter walls of the modular data center 10.

The power distribution unit 14 typically contains a transformer, and power distribution circuitry, such as circuit breakers, for distributing power to each of the racks in the modular data center 10. The power distribution unit 14 provides redundant power to the racks 18 and can monitor the total current draw. An uninterruptible power supply can provide uninterruptible power to the power distribution unit 14. Preferably, the power distribution unit 14 includes a 40 kW uninterruptible power supply having N+1 redundancy, where the ability to add another power module provides N+1 redundancy. In one embodiment, input power to the power distribution unit 14 is received through the top of the rack from a voltage feed 58. In one embodiment, the voltage feed 58 is a 240 volt feed (or 208 volt feed for three-phase) coupled to the power distribution unit 14 that enters through the roof panel 56. Alternatively, the input power may be received from underneath the rack, as through a raised floor, or through the back of the rack.

The power protection unit 12 provides redundant power protection for centralized information technology equipment, as is contained in the equipment racks 18. The power protection unit 12 can have individual power modules and battery modules that can be individually added or removed to accommodate different load requirements. The use of multiple power modules and battery modules provides redundancy by allowing continued operation despite the failure of any one power module or battery module. For example, the power protection unit can include a Symmetra PX® scalable, uninterruptible power supply having a three-phase input and a three-phase output, available from American Power Conversion Corporation, of West Kingston, Rhode Island, or the power protection unit can include one of the uninterruptible power supplies described in U.S. Pat. No. 5,982,652, titled, "Method and Apparatus for Providing Uninterruptible Power," which is incorporated herein by reference.

The floor mounted cooling unit 16 provides heat removal by use of a chilled water supply, which enters the unit through supply line 60. Alternatively, the cooling units can provide heat removal using DX compressorized cooling via use of a direct expansion refrigerant-based unit, which can be in the unit itself. The cooling unit may contain a primary chilled water coil and secondary direct expansion coil within the same frame. The cooling unit can be configured for air, water or glycol use. Cooled air can be released through the bottom of the unit or the top of the unit. In one embodiment, cool air is released from the cooling unit 16 out its front face, so that the air flow is from the back of the rack and out the front of the rack. The cooling unit 16 can further be configured as one, two or three modules. In the embodiment shown in FIG. 1, a three-module cooling unit is used.

In the embodiment of FIG. 1, each of row 32 and row 34 is comprised of six racks. In some embodiments, the number of racks and the function of the equipment in the racks can vary. In one embodiment, the racks 18 are modified standard 19 inch racks, such as those available from American Power Conversion Corporation of West Kingston, R.I., under the trade name NETSHELTER VX Enclosures®.

The back face of each of the power distribution unit 14, the power protection unit 12, the floor mounted cooling unit 16, and the equipment racks 18 faces the interior of the modular data center 10, or the hot room 22. Essentially, the back faces of the racks in row 32 face the back faces of the racks in row 34. In one embodiment, the equipment racks 18 have their rear doors removed so that each rack 18 remains open to the inside of the hot room 22. In the embodiment shown, the modular data center 10 contains seven equipment racks 18. Alternatively, in another embodiment, six equipment racks 18 complete the rows, but more than seven equipment racks 18 can complete the rows contained in the data center 10 and can be adjacent to one another or adjacent to other enclosures in the data center 10, such as the power distribution unit 14, the power protection unit 12, or the floor mounted cooling unit 16.

The door 52 located at the end of the row of racks is attached with hinges 53 to a detachable frame 55. The detachable frame 55 is located behind the power protection unit 12. The detachable frame may be positioned behind any one of the power protection unit 12, the power distribution unit 14, or the equipments racks 18, depending on which of the units are positioned at the end of a row in the data center 10. The detachable frame 55 allows the door 52 to be quickly removed for replacement of the power protection unit 12 if necessary. The hot room is accessible by the door 52 and can be monitored through the observation window 54. Preferably, a door 52 is located at each end of the hot room 22. Generally, the door 52 is a 2×36 inch insulated, lockable steel door having an insulated observation window 54.

The water or refrigerant supply and return 60 can enter the hot room through supply pipes into the roof 56 or directly into the roofs of the racks. The voltage feed 58 can also enter through the roof 56 or through the roofs of the racks. Alternatively, the water or refrigerant supply and return 60 and the voltage feed 58 enter the hot room through a raised floor on which the modular data center rests or from another location outside of the room and into the racks, such as into the sides of the racks.

The roof panel 56 is preferably a semi-transparent plexiglass roof panel supported by steel supports 62 that are positioned at intervals along the length 72 of the data center 10. The roof 56 extends to cover the top of the hot room 22 located in the middle of the rows of racks. The roof 56 can be easily detachable to allow for removal of racks 18 or the power protection unit 12 when necessary. A roof panel 56 constructed of semi-transparent plexiglass allows room light to enter the space defining the hot room 22. Additionally, the plexiglass roof 56 is preferably substantially airtight.

The hot room 22 is completely enclosed and has walls formed by the backside of the racks 18 and walls comprised of the door 52 attached at each end of the hot room 22. Alternatively, panels without doors can be the walls that complete the hot room. The hot room 22 is a substantially airtight passageway when the roof panel 56 is in place. Thus, the modular data center 10 is an enclosed computer infrastructure defined on its outside perimeter by the front face of each of the racks 18, power protection unit 12, power distribution unit 14, and cooling unit 16, and having a hot room 22 in its midsection. The outside walls of the hot room formed by the doors 52 are a portion of two of the outside walls of the modular data center 10.

Figure 2:
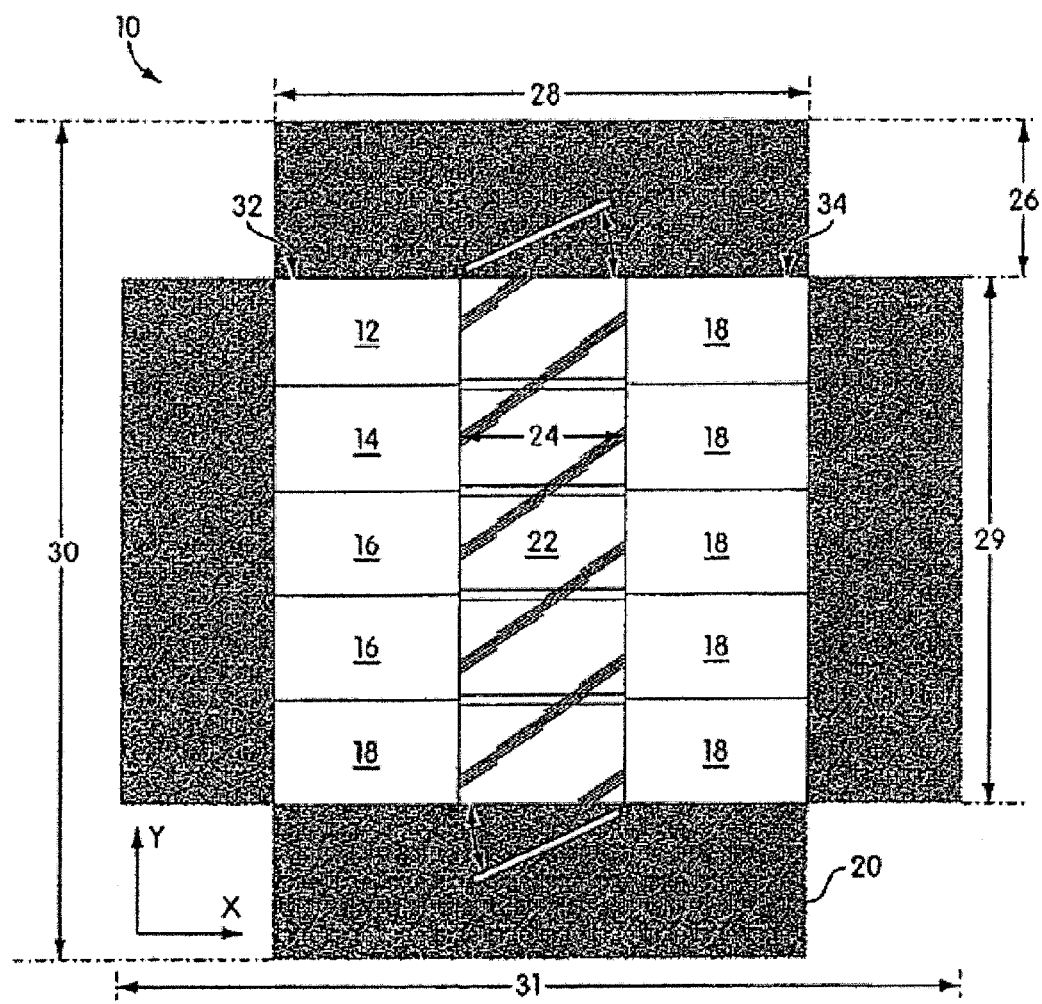
FIG. 2 is a top view of another modular data system, similar to the system of FIG. 1.

Referring to FIG. 2, a top view of a modular data center 10 is shown. The modular data center of FIG. 2 is similar to that of FIG. 1, but has five racks in each of row 32 and row 34, rather than the six racks in each row of FIG. 1. With like numbers referring to like embodiments, the modular data center 10 of FIG. 2 is comprised of the power distribution unit 14, the power protection unit 12, the floor mounted cooling unit 16, the equipment racks 18, and the hot room 22. The power protection unit 12 is positioned directly adjacent to one side of the power distribution unit 14, while a floor-mounted cooling unit 16 is positioned on the other side of the power distribution unit. A service clearance area 20 surrounds the modular data center 10. In FIG. 2, an embodiment is shown having six equipment racks 18 and a cooling unit 16 having two modules.

The dimensions of the modular data center 10 depend on the number of racks included in each of the rows of racks. For example, a data center 10 having six equipment racks 18 can have a width of 120", indicated by arrow 28, a length of 120", indicated by arrow 29, and a hot room width (row separation) of 36", indicated by arrow 24, and a service clearance 26 of preferably 36" in width. With the inclusion of the service clearance 26, the floor surface area for the data center 10 is, preferably, a length 30 of 192" and a width 31 of 192". Alternatively, and referring again to FIG. 1, a data center 10 having seven equipment racks 18 can have a width of 120" and a length of 144". With the inclusion of the service clearance 26, the floor surface area for an alternate data center is 192" by 216". The dimensions of the modular data center are given only as examples, but can vary significantly depending upon the type and size of racks used to design the data center.

The modular data center 10 is operational when provided with a source of chilled water, condensor water or refrigerant piping 60 and a voltage feed 58. The data center can include a number of different power input designs, but is preferably a 40 kW design, allowing 6.7 kW/rack in a system having six equipment racks 18, or 5.7 kW/rack in a system having seven equipment racks 18, for example. Cooling water or refrigerant enters the floor mounted cooling units 16 via supply lines 60. A common supply line 60 can provide cooling water to one or more cooling units simultaneously, as the cooling units 16 are connected to the common supply 60 with flexible hose that is easily disconnected.

The modular data center 10 provides cooling for equipment in the data center as follows. Air from the room, or ambient air, filters through the front of the racks 18 to cool the equipment stored in the racks 18. Air enters through the front of the racks 18 and is expelled out of the backside of the racks 18. As the air passes through the equipment racks 18, the temperature of the air rises. The respectively warmer air is expelled into the hot room 22. The hot room 22 contains the warm air and prevents the warm air from mixing with air in the surrounding room. The cooling unit 16 draws warm air from the hot room and returns cool air to the room outside the data center 10. The warm air enters the cooling units 16 directly from the hot room 22. The cooling unit acts to lower the temperature of the air, and the cooled air is then released into the surrounding area. The air is recycled to the surrounding room at a substantially cooled temperature. For example, the cooling unit 16 generally receives air from the hot room at 95° F. and cools it to a temperature of approximately 72° F. before it is released into the area surrounding the data center 10. The floor mounted cooling unit 16 operates at substantially higher supply and return temperatures, allowing realization of high capacity without latent heat removal.

Figure 3:
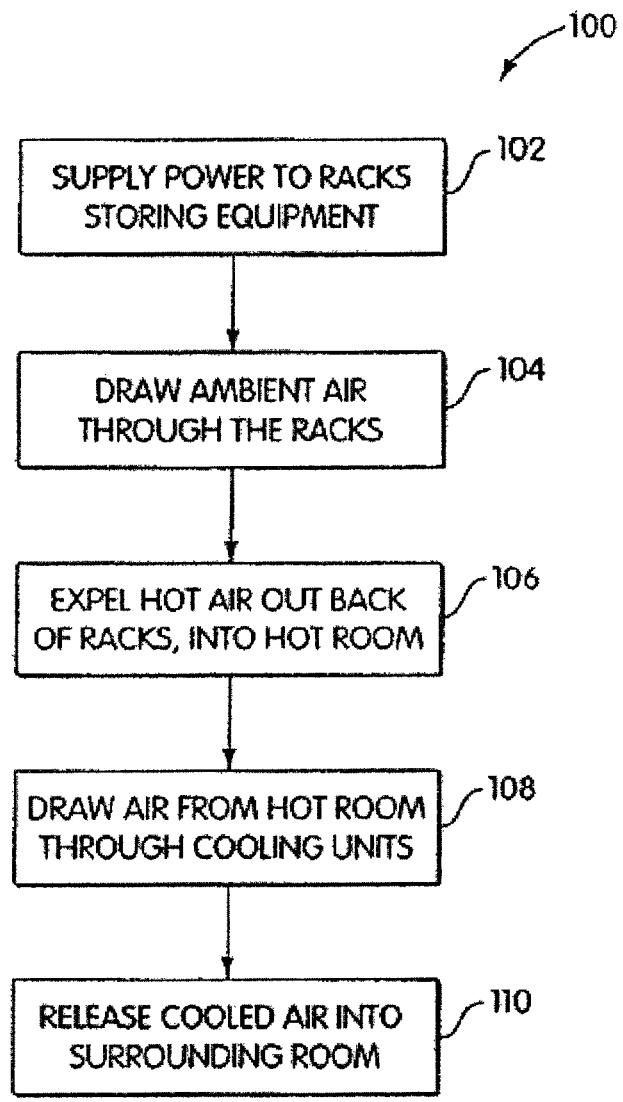
FIG. 3 is a block flow diagram of a process of cooling equipment mounted in modular data centers.

Referring to FIG. 3, with further reference to FIGS. 1-2, the data center 10 is configured to perform a process of cooling equipment stored in enclosed racks using an infrastructure having independent power and coolant supplies. The process 100 includes the stages shown, although the process 100 may be altered, e.g., by having stages added, deleted, or moved relative to the stages shown.

The process 100 of FIG. 3 includes stage 102, wherein power is supplied from a power distribution unit to a plurality of equipment racks 18. The equipment racks 18 may contain a variety of electronic equipment that requires a consistent power supply to avoid system downtime. Power is supplied via the voltage feed 58 that is connected to the power distribution unit 14, with the power protection unit 12 being preferably disposed adjacent to the power distribution unit 14 to ensure redundant power supply.

At stage 104, the racks 18 draw cool air from the surrounding room through the front face of the racks 18. There may, for example, be an air distribution unit within the racks and/or within equipment contained in the racks that draws the room air into the rack 18 and distributes the air throughout the rack to cool components contained in the rack. As the air passes through the rack 18, the air increases in temperature.

At stage 106, the racks 18 expel the air at an increased temperature into the hot room 22. The air is expelled out of the backside of the racks 18. As described above, in one embodiment, the racks 18 do not have rear doors. In other embodiments, rear doors may be included on the racks with the warm air being expelled into the hot room through vents in the doors. Air is held in the hot room 22 at an increased temperature and mixing of the warm air with the surrounding ambient air is prevented. In one embodiment, the modular data center is designed to maintain an air pressure in the hot room that is approximately equal to the air pressure outside the hot room. This allows one of the doors to be opened without allowing cool air to enter the hot room. In one such embodiment, the cooling unit provides 160 cfm/kW.

At stage 108, the cooling unit draws the warm air from the hot room 22. The cooling unit 16 uses the cold water from the cold water supply 60 to cool the air from the hot room. At stage 110, the cooled air is released from the cooling unit into the surrounding room, which completes the cooling cycle. The air in the surrounding room is then drawn into the racks 18 once again, and the cycle continues.

Other embodiments are within the scope and spirit of the appended claims. For example, air could be forced up through the equipment racks 18. Air moved through the racks 18 could be of varying temperatures, including hot air. The data center 10 may be configured to distribute gases other than air. Additionally, a refrigerant or other coolant may be used rather than cold water. Further, a controller can be coupled to the data center 10 to monitor air temperatures and flow rates, as well as power supply so that each rack is provided adequate power consistently. A data center may contain a single equipment rack 18 having a single cooling unit 16 creating an individual data center, whereby power is distributed to a single data center 10 or multiple single-rack data centers simultaneously.

In one embodiment, one or more cooling units are centrally located in the modular data center to try to equalize the draw of hot air from each of the racks into the cooling unit. In other embodiments, the cooling units may placed in other locations, and in one embodiment, one or more cooling units may be positioned to be closest to a rack or racks that generate the greatest heat in the modular data center.

Further, in some embodiments, the roof over the hot area may include a number of fans that are controlled to exhaust air from the hot area in the event of a failure of an air conditioning unit in the modular data center, and/or when air temperature in the hot area exceeds a predetermined limit or if air pressure in the hot area exceeds a predetermined limit.

In some embodiments described above, racks of modular data centers are described as being arranged in two rows. In other embodiments, the racks can be arranged in other geometrical configurations. Further, on sides of a modular data center, one or more racks can be used in addition to or in place of one or both side panels.

Figure 4:
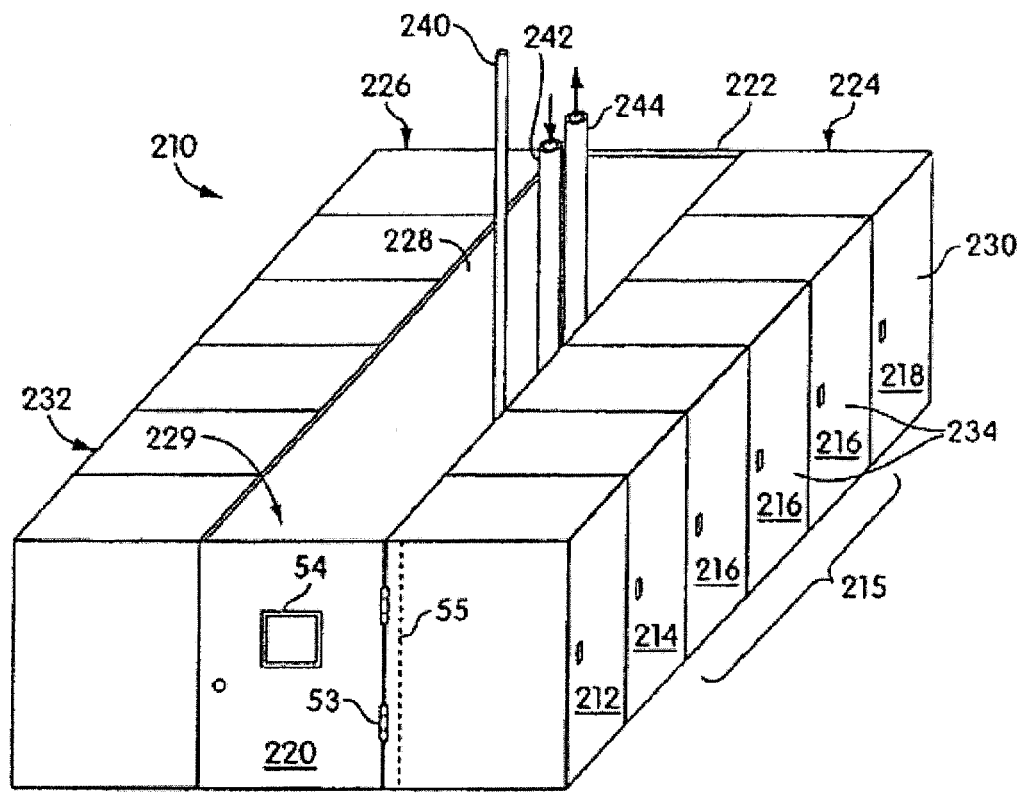
FIG. 4 is a perspective view of a system including rack-mounted equipment and cooling units.

Still further embodiments are within the scope and spirit of the invention. Referring to FIG. 4, a system 210 includes a power protection unit 212, a power distribution unit (PDU) 214, a floor-mounted cooling system 215 that includes multiple cooling units 216, equipment racks 218, and doors 220, 222. As used here, the devices 212, 214, 216, 218 refer to functional equipment (as appropriate), mounting brackets, and/or enclosures/housings containing the brackets and equipment. Thus, the racks 218 as used here refer to mounting brackets (for mounting electronic, heat-producing equipment) and/or to the housings that contain the mounting brackets and allow passage of gas through the housings. The system 210 is configured with the devices 212, 214, 216, 218 disposed in two displaced rows 224, 226 connected by the doors 220, 222. Backs of the devices 212, 214, 216, 218 are disposed adjacent (and possibly connected) to each other to form two sides of a hot region 228 with the doors 220, 222 forming two other sides of the hot region 228. The doors 220, 222 may help control access to equipment in the racks 218, e.g., by being locked to restrict access to the hot region 228. While the cooling units 216 are shown disposed adjacent to each other with an end unit disposed adjacent to the PDU 214, this is not required and other positions of the cooling units 216 relative to the other devices 212, 214, 218 are acceptable.

Although the system 210 is shown arranged in the two rows 224, 226 connected by the doors 220, 222, other arrangements are acceptable. For example, the system 210 could be configured in triangular, circular, or rectangular/square arrangements, etc. Further, while two doors 220, 222 are shown, other quantities of doors, e.g., one or three, etc. may be used. Additionally, panels that do not open may be used in place of any or all (although preferably not all) of the doors. The system 210 provides a laterally or horizontally restrictive environment defining the hot region 228 and inhibiting gas from exiting laterally from the hot region 228 except through the cooling system 215.

The system 210 helps to contain heated air in the hot region 228 and isolate the heated air expelled from the racks 218 from cooled air provided by the cooling system 215. The equipment in the racks 218 draw cool air from fronts 230, 232 of the racks 218 and expel heated air out backs of the racks 218 into the hot region 228. The flow of gas through the equipment inhibits gas from flow from the hot region 228 through the racks 218 toward the fronts 230, 232. Further, the doors 220, 222 are thermally-insulating doors that help contain heat from the gas in the hot region 228. The devices 212, 214, 216, 218 and the doors 220, 222 provide a top opening 229 allowing gas from the hot region 228 to vertically exit the hot region 228, e.g., by rising. The doors 220, 222 are at least about as tall as the shortest of the devices 212, 214, 216, 218 to help retain heated gas in the hot region 228. Preferably, the devices 212, 214, 216, 218 and the doors 220, 222 are about the same height. The doors 220, 222 and the flow of gas through the racks 218 help contain heated gas in the region 228 and isolate heated gas in the region 228 from gas outside of the system 210. Isolating and containing the heated gas helps inhibit heated gas from flowing horizontally and combining with cooled gas provided by the cooling system 215. Devices such as the power protection unit 212 and the PDU 214 exhaust small quantities of heated gas into the hot region 228.

The cooling system 215 is configured to draw heated gas from the hot region 228, cool it, and provide cool gas to the exterior of the system 210 near bottoms of the fronts 230, 232 of the racks 218. The system 215 is powered through a voltage feed 240 and uses cold water or other refrigerant from a supply line 242 to cool the drawn-in air. The water or other refrigerant, having been raised in temperature, leaves the system 215 via a return line 244 to be re-cooled. Preferably, the cooling units 216 are disposed and configured to draw in significant amounts of the heated air/gas from the hot region 228 before the heated gas rises and exits the region 228. The heated gas, typically about 95° F., is cooled by the units 216 to about 72° F. and expelled out fronts 234 of the units 216 near the fronts 230, 232 of the racks 218. If no cooling units 216 are disposed in the same row 224 or 226 with equipment racks 218, naturally occurring convection effects cause cool gas from one or more of the units 216 to flow to the fronts 232 of the racks 218 in the other row 224, 226. Preferably the cooling units 216 provide cool gas near the floor (near bottoms of the racks 218) and in amounts such that most of the cool gas is drawn into the equipment racks 218. The units 216 can direct cool gas as desired using, e.g., fans, ducts, vents, vanes, pipes, etc. The units 216 cool the gas without significant latent heat removal (dehumidifying cooling) and without introducing moisture into the gas.

The cooling system 215 is a computer room air conditioner (CRAC) disposed in close proximity to heat-producing equipment in the equipment racks 218. Locating the cooling system 215 close to the racks 218 reduces and/or eliminates problems encountered by systems with CRACs displaced significantly far from the heat-producing equipment, in particular problems getting cool air from the CRAC to the heat-producing equipment. For example, the cooling system 215 can use lower air/gas velocity than displaced systems, reducing the pressure drop (fan coil CRAC pressure loss), and thus use lower fan power to propel the air/gas.

Embodiments of the system 210 may have similar dimensions to the data center 10 shown in FIG. 1. For example, with seven equipment racks 218 the system 210 may have a length, including 36" service clearance on both ends, of 216" and a width, including 36" service clearance on both sides, of 192".

Embodiments of the system 210 may include features of the system 10 not specifically mentioned with respect to the system 210. For example, the doors 220, 222 can have windows configured and disposed for viewing by adults. Further, the system 210 can include a UPS connected, through the PDU 214, to provide power to devices in the system 210 to help ensure uninterrupted power for desired devices in the system 210. Other features may also be included in the system 210.

Figure 5:
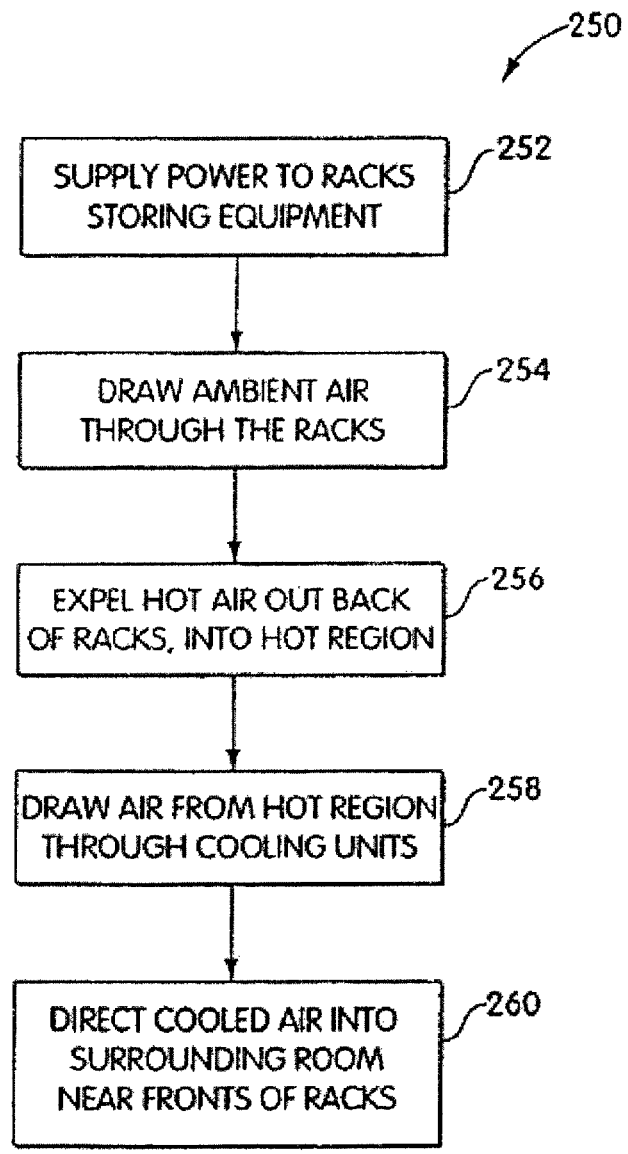
FIG. 5 is a block flow diagram of a process of cooling equipment in the system shown in FIG. 4 using cooling units of the system shown in FIG. 4.

Referring to FIG. 5, with further reference to FIG. 4, the system 210 is configured to perform a process 250 of cooling equipment stored in enclosed racks using an infrastructure having independent power and coolant supplies. The process 250 includes the stages shown, although the process 250 may be altered, e.g., by having stages added, deleted, or moved relative to the stages shown.

At stage 252, power is supplied from the power distribution unit 214 to the equipment racks 218. The equipment racks 218 may contain a variety of electronic equipment that uses a consistent power supply to avoid system downtime. Power is supplied via the voltage feed 240 that is connected to the power distribution unit 214, with a power protection unit 212 preferably being disposed adjacent to the power distribution unit 214 and configured to ensure redundant power supply.

At stage 254, the racks 218 draw cool air from the surrounding room through the front faces 230, 232 of the racks 218. There may, for example, be an air distribution unit within the racks 218 and/or within equipment contained in the racks 218 that draws the room air into the racks 218 and distributes the air throughout the racks 218 to cool components contained in the racks 218. As the air passes through the racks 218, the air increases in temperature.

At stage 256, the racks 18 expel the air at an increased temperature into the hot region 228. The air is expelled out of the backside of the racks 218, e.g., through slots or vents in rear doors or directly into the region 228 if the racks 218 do not have rear doors. Air is restrained in the hot region 228 by the devices 212, 214, 216, 218, the doors 220, 222, and the flow of air into the region 228, thus inhibiting mixing of the warm air with the surrounding ambient air.

At stage 258, the cooling units 216 draw the warm air from the hot region 228. The cooling units 16 use the cold water from the cold water supply 242 to cool the air from the hot region 228.

At stage 260, the cooled air is released from the cooling units 216 into the surrounding room. The cool air is expelled from the units 216 and directed to the fronts 230, 232 of the racks 218. The air in the surrounding room is then drawn into the racks 218 once again, and the cycle continues. Preferably, the units 216 and the racks are configured such that the units provide the cooled air and the racks 218 draw in the cool air such that much of the cooled air is drawn into the racks 218, e.g., to help reduce mixing of the cooled air and the heated air from the hot region 228.

Embodiments may provide one or more of the following capabilities. Mixing of exhaust air with cool air in a data center is reduced. Hot spots around groups of high power racks can be reduced by containing such high power racks in a modular data center as described above. The use of localized cooling allows air conditioning units in a data center, including within modular data centers, to operate more efficiently and produce cool air at higher temperatures, thereby negating the need for humidifying systems. Temperature gradients may be reduced compared to prior systems. Equipment reliability can be improved compared to prior equipment/cooling arrangements. Cooling units can operate with good efficiency and near their designed capacities. Equipment can be cooled using less energy than with previous systems. Cooling unit efficiency compared to prior systems can be increased, and cooling units that are smaller and/or have lower capacities than in prior systems can be used to provide similar cooling effects (e.g., to cool similar-sized regions). Standard building fire protection and lighting can be used for a data center. Existing data centers can be easily retrofitted/upgraded in accordance with the invention. Physical security may be improved compared to prior systems.

Still further capabilities may be provided, such as sensible heat ratios near one may be achieved. The sensible heat ratio (SHR) is the sensible cooling capacity QS divided by the total cooling capacity QT (SHR=QS/QT). The sensible and total cooling capacities in BTU are given by:

$$QS=(T_1-T_2)\cdot CFM\cdot 1.08$$

$$QT=(H_1-H_2)\cdot CFM\cdot 4.45$$

where $T_1$ is the temperature of gas entering the cooling unit 216, $T_2$ is the temperature of gas exiting the cooling unit 216, $H_1$ is the enthalpy of gas entering the cooling unit 216, $H_2$ is the enthalpy of gas exiting the cooling unit 216, 1.08 is a constant for standard air for converting delta temperature to BTU when multiplied by CFM, 4.45 is a constant for standard air converting delta enthalpy to BTU when multiplied by CFM, and CFM is the amount of gas (entering and exiting, respectively, the unit 216) in cubic feet per minute. For example, for an incoming temperature $T_1$ of 80° F. at 36% RH (relative humidity), an incoming enthalpy $H_1$ of 27.82 btu/lbmass, an exit temperature $T_2$ of 50° F. at 95% RH, and an exit enthalpy $H_2$ of 19.89 btu/lbmass, the SHR is about 0.92.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A system for containing and cooling electronic equipment, the system comprising:
   housing means for housing electronic equipment and comprising at least two separate units configured to allow gas to pass through the housing means from a first region to cool the electronic equipment and allow the electronic equipment to expel heated gas to a second region;
   enclosure means, coupled to the at least two separate units of the housing means, for enclosing the second region and separating the second region from the first region; and
   exhaust means coupled to at least one of the housing means or the enclosure means for exhausting the heated gas out of the second region, the exhaust means comprising cooling equipment;
   wherein each of the at least two separate unit and the cooling equipment includes a front face and a back face, and wherein the back face of the cooling equipment faces the back face of at least one of the at least two separate units.

2. The system of claim 1 wherein the cooling equipment is configured to draw the heated gas from the second region into the cooling equipment, cool the heated gas drawn into the cooling equipment to produce cooled gas and provide the cooled gas to the first region.

3. The system of claim 1 wherein the exhaust means comprises a fan coupled to the enclosure means.

4. The system of claim 1 wherein the enclosure means comprises a first panel coupled between the at least two separate units, a second panel coupled between at least two separate units, and a roof panel coupled between the first and second panels and the at least two separate units.

5. The system of claim 4 wherein at least one of the first panel or the second end panel includes a door.

6. The system of claim 4 wherein at least one of the first panel, the second panel, or the roof panel is detachable.

7. The system of claim 1 wherein a first unit of the two separate units includes an uninterruptible power supply to provide power to equipment in at least one other unit of the at least two separate units.

8. A method of containing and cooling electronic equipment, the method comprising:
   housing electronic equipment in at least a first rack and a second rack, the first and second racks each having a front face and a back face, at least portions of the first and second racks being configured to allow gas to be drawn in through the respective front faces and to allow heated gas to be expelled through the respective back faces;
   collecting heated gas expelled through the portions of the first and second racks in a common area adjacent the back faces of the first and second racks, including substantially containing the heated gas in the common area using at least two end panels coupled to the first and second racks and one roof panel coupled to the at least two end panels and the first and second racks; and
   exhausting the heated gas out of the common area.

9. The method of claim 8 further comprising maintaining a first air pressure inside the common area that is substantially equal to a second air pressure outside of the common area.

10. The method of claim 9 further comprising powering the electronic equipment with an uninterruptable power supply housed in one of the first or second racks.

11. The method of claim 8 wherein exhausting the heated gas comprises drawing the heated gas into cooling equipment, the method further comprising:
   cooling the heated gas in the cooling equipment; and
   providing the cooled gas toward the front faces of the first and second racks.

12. The method of claim 8 wherein exhausting the heated air out of the common area is performed in response to an air temperature in the common area exceeding a threshold level.

13. The method of claim 8 further comprising exhausting the heated gas to an area above the common area.

* * * * *